(12) United States Patent
Edwards

(10) Patent No.: US 10,242,979 B1
(45) Date of Patent: Mar. 26, 2019

(54) DYNAMIC SUBSTRATE BIASING FOR EXTENDED VOLTAGE OPERATION

(71) Applicant: NXP USA, INC., Austin, TX (US)

(72) Inventor: Willliam Ernest Edwards, Dexter, MI (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/018,958

(22) Filed: Jun. 26, 2018

(51) Int. Cl.
| | |
|---|---|
| *H01L 27/02* | (2006.01) |
| *H01L 29/866* | (2006.01) |
| *H01L 29/06* | (2006.01) |
| *H01L 29/10* | (2006.01) |
| *H01L 23/62* | (2006.01) |
| *H01L 27/12* | (2006.01) |
| *H01L 49/02* | (2006.01) |
| *H02H 9/04* | (2006.01) |

(52) U.S. Cl.
CPC .......... *H01L 27/0296* (2013.01); *H01L 23/62* (2013.01); *H01L 27/0207* (2013.01); *H01L 27/0255* (2013.01); *H01L 27/0288* (2013.01); *H01L 27/0292* (2013.01); *H01L 27/1203* (2013.01); *H01L 28/40* (2013.01); *H01L 29/0649* (2013.01); *H01L 29/1075* (2013.01); *H01L 29/1095* (2013.01); *H01L 29/866* (2013.01); *H02H 9/046* (2013.01); *H01L 27/0259* (2013.01); *H01L 27/0266* (2013.01)

(58) Field of Classification Search
CPC . H01L 23/62; H01L 27/0207; H01L 27/0255; H01L 27/0288; H01L 27/0292; H01L 27/0296; H01L 27/1203; H01L 28/40; H01L 29/0649; H01L 29/1075; H01L 29/1095; H01L 29/866; H02H 9/046
See application file for complete search history.

(56) References Cited

U.S. PATENT DOCUMENTS

| | | | |
|---|---|---|---|
| 5,786,616 A | * | 7/1998 | Fukumoto ........... H01L 27/1203 257/350 |
| 5,923,067 A | * | 7/1999 | Voldman ............. H01L 27/0255 257/349 |
| 6,628,493 B1 | | 9/2003 | Chen et al. |
| 6,690,065 B2 | | 2/2004 | Chang et al. |
| 2002/0125934 A1 | | 9/2002 | Wu et al. |

(Continued)

FOREIGN PATENT DOCUMENTS

JP          2007294765 A  * 11/2007

*Primary Examiner* — Allan R Wilson

(57) ABSTRACT

A device includes an integrated circuit (IC) layer, an insulative layer such as a buried oxide (BOX) layer, a substrate layer separated from the IC layer by the insulative layer, and a set of protective components such as a set of Zener diodes or a Zener stack coupled to the IC layer to protect the IC layer from transient electric events such as an electrostatic discharge (ESD), an inductive flyback, and a back electromotive force (back-EMF) event. The Zener stack has a Zener breakdown voltage greater than a breakdown voltage of the IC layer. An effective bias voltage has a voltage level less than the breakdown voltage of the IC layer. The Zener diode or Zener stack may be coupled to one or more isolation structures of the IC layer. The isolation structures separate the IC layer into electrically distinct portions or wells in which other electric components are formed.

20 Claims, 6 Drawing Sheets

(56) References Cited

U.S. PATENT DOCUMENTS

| | | | |
|---|---|---|---|
| 2005/0269642 A1* | 12/2005 | Minami | H01L 27/0255 |
| | | | 257/355 |
| 2007/0090458 A1* | 4/2007 | Muramoto | H01L 27/1203 |
| | | | 257/347 |
| 2011/0266592 A1* | 11/2011 | Hawe | H01L 27/0255 |
| | | | 257/109 |
| 2016/0276332 A1* | 9/2016 | Laine | H01L 27/0251 |
| 2016/0322385 A1 | 11/2016 | Fuh et al. | |
| 2018/0131369 A1* | 5/2018 | Popplewell | H03K 17/102 |

* cited by examiner

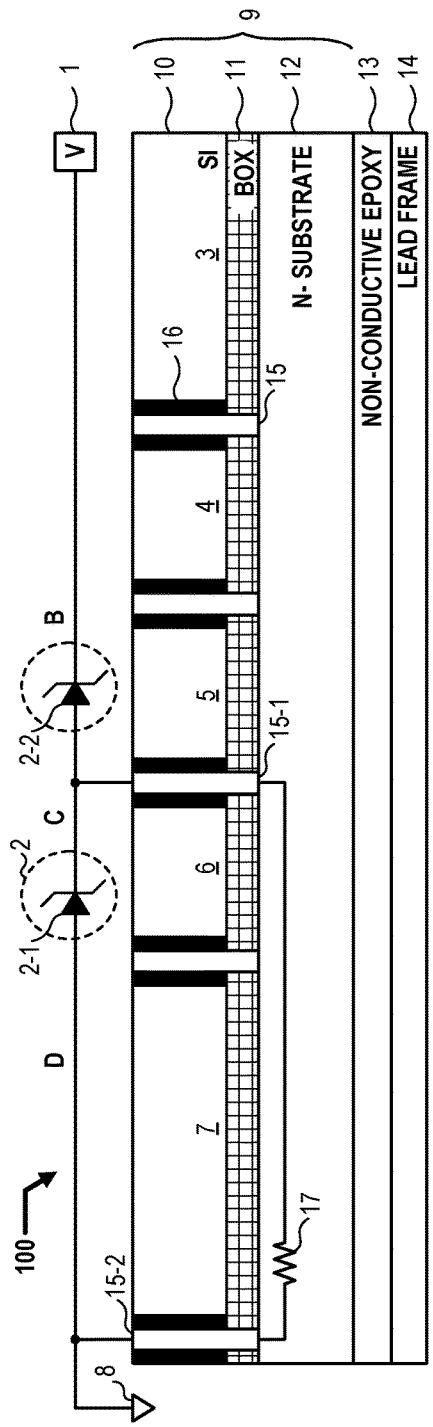
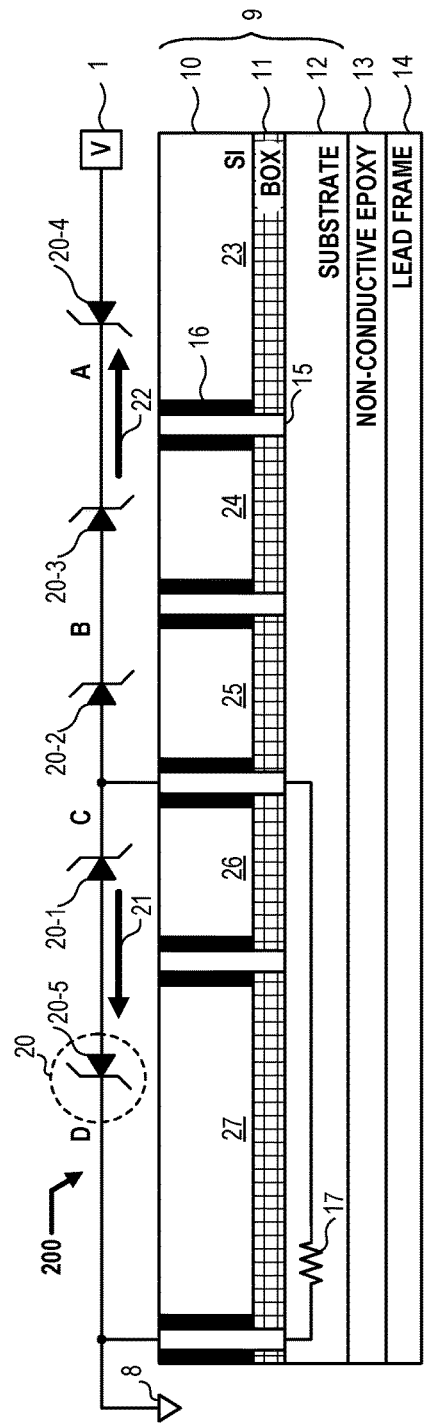
FIG. 1
FIG. 2

DYNAMIC SUBSTRATE BIASING FOR EXTENDED VOLTAGE OPERATION

BACKGROUND

Transient events in electronics can create voltages exceeding process and device maximum voltage ratings in integrated circuits. Example transient events include an electrostatic discharge (ESD), an inductive flyback, and a back electromotive force (back-EMF) event. Various solutions have been proposed to mediate transient events including power surges of either an AC or DC current. However, conventional techniques do not adequately protect deep trench dielectrics located in isolated processes of integrated circuits (ICs). Exceeding a maximum rating of deep trench dielectrics can degrade long-term reliability and result in oxide rupture and catastrophic failure.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

FIG. 1 is a block diagram of a cross-sectional view of a device including a voltage divider and a substrate in accordance with some embodiments for protecting against voltage transients.

FIG. 2 is a block diagram of a cross-sectional view of a device in accordance with additional embodiments.

DETAILED DESCRIPTION

Figure 3:
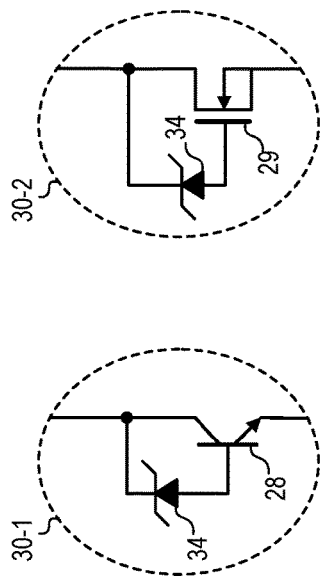
FIG. 3 is a schematic diagram of voltage protection elements in accordance with additional embodiments.

Increasingly, IC devices employ several voltage sources of different voltage levels. Typically, different voltage sources are kept separate by galvanically separating different circuits from one another in a device, each of the different circuits using a separate voltage source. Using different voltage levels in a single circuit puts the combined circuit at risk for transient events which can result in negative consequences. In a traditional integrated circuit (IC), the substrate is biased to a single potential, typically ground, and is maintained at a low impedance with little or no current flow. In junction isolated processes, substrate current can cause significant voltage drops and turn on parasitic transistors causing the IC to malfunction.

Contrary to conventional design, protective devices, systems and methods described herein implement a voltage divider to create a gradient or differential voltage across an IC substrate, when needed, to keep local voltages across individual isolated regions of an IC die less than an intrinsic breakdown voltage of the deep trench isolation (DTI) material. This technique allows a peak or transient voltage in the overall circuit to be greater than the intrinsic breakdown voltage of a dielectric isolation material. During a transient event, a differential voltage across certain isolated regions in the IC die remains less than a maximum rating of the dielectric isolation material. In short, a voltage divider locally biases the IC substrate to protect against transient events. Practical concerns influence an exact resistance per unit measure of the IC substrate including various voltage levels coupled to an IC die and geometries of the various components coupled to the IC substrate.

Also described herein are methods and systems to protect deep trench oxides from transient electric events exceeding a theoretical breakdown voltage by dynamically biasing the substrate. The transient voltage is divided across multiple isolated regions such that the voltage across any single trench is less than the theoretical breakdown voltage. An integrated circuit with dielectric isolation better survives transient electric events that exceed the maximum rating of the DTI material. Using the techniques described herein, a monolithic implementation may be achieved, instead of requiring use of two or more separate and galvanically isolated circuit dies. Low voltage components of a device are protected against relatively higher voltage regions and higher voltage components within the same device. For example, the described techniques are effective to protect capacitive galvanic isolation for communication links in mild hybrid cars. Additionally, these techniques allow a monolithic solution for low side drivers with inductive loads protecting the DTI material when inductive flyback exceeds the intrinsic breakdown voltage of the dielectric.

FIG. 1 is a block diagram of a cross-sectional view of a device 100 including a voltage divider and an IC die substrate in accordance with some embodiments for protecting against voltage transients. FIG. 1 illustrates general principles of operation of the various components for a unidirectional example of current flow in the device 100 for sake of simplicity. The device 100 includes a plurality of voltage protection components 2 arranged in a voltage protection stack or "stack" such as a set of Zener diodes 2-1, 2-2 positioned or stacked in a Zener stack configuration. A first Zener diode 2-1 and a second Zener diode 2-2, which are coupled in series with each other, are positioned adjacent to an IC composite layer 9. Intermittently, in operation, the device 100 is subjected to transient events represented by a voltage source 1 (labeled "V"). A top at a cathode of the Zener stack is illustrated on a right side and a bottom at an anode of the Zener stack is coupled to a common ground 8 as shown on a left side. While only two Zener diodes are shown, other numbers of Zener diodes and other configurations of Zener diodes or other simple or complex protection components may be stacked together such as in series between ground 8 and the voltage source V.

The IC composite layer 9 includes a silicon-based IC layer 10, a buried oxide (BOX) layer 11, and a N- doped substrate 12, which are not shown to scale, including in regard to their respective thicknesses. The Zener stack is coupled in parallel with the substrate layer 12 of the IC composite layer 9. The Zener stack protects the IC composite layer 9 from the transient events. By way of example, a thickness of the silicon layer 10 is 0.05 μm, a thickness of the BOX layer 11 is 0.2 μm, and a thickness of the N-substrate 12 is 50 to 500 μm. The N-substrate 12 intrinsically has a resistance 17.

According to some embodiments, the IC layer 10 is divided into wells or isolated regions 3, 4, 5, 6, and 7 that are electrically isolated by deep trench isolation (DTI) structures 16 that have an intrinsic breakdown voltage or limit. Between the DTI walls are poly silicon or "poly" structures 15 allowing electrical connections from the surface of IC composite structure 9 to the N-substrate 12. The substrate via a first poly structure is coupled at a first point to the Zener stack of Zener diodes 2-1, 2-2 as shown. As understood by those in the art, the wells 3-7 of the IC layer 10 include conventional circuit components and are not shown in the wells 3-7 for sake of convenience of illustration in order to not obscure operation of the other components. The wells 3-7 are separated from the respective poly structures 15 by the DTI structures 16. The poly structures 15 act as a sinker or via allowing metallization on top to contact the N-substrate 12. The DTI structures 16 and the BOX layer 11 maintain the wells 3-7 electrically separate from one another and from the N-substrate 12 according to their respective properties. The IC composite layer 9 is coupled to a frame such as a lead frame 14 by way of an electrically non-conductive epoxy 13.

According to some embodiments, the entire substrate is uniformly biased to ground. In operation, the N-substrate 12 is locally biased to a certain voltage above ground in order to protect the wells (DTI 16 and BOX 11) 3, 4, 5, 6, 7 and components in the wells from transient events such as voltage spikes, electrostatic discharges (ESDs), inductive flybacks, and back electromotive force (back-EMF) events. An example is provided to show operation of the various components during a transient event. When the external voltage source 1 exceeds the breakdown voltage of the Zener stack, current flows from C through the substrate such as a first substrate 15-1 and a second substrate 15-2 to ground 8. The resistance of the substrate 17 and the current create a voltage gradient equal to the Zener breakdown from C to 8. The differential voltage between each isolated region 3-4, 4-5, 5-6 and 6-7 is limited to that of the Zener breakdown which is less than the intrinsic breakdown voltage of the DTI material. The differential voltage across the BOX 11 from nets B, C and D to the N- substrate is a net voltage. By way of example, the voltage across the BOX 11 for isolated region 3 is equal to V(B)-V(C). A rating or reverse breakdown voltage of the first Zener diode 2-1 is 50V, and the rating breakdown voltage of the second Zener diode, 2-2 is 100V making the Zener stack breakdown voltage 150V for the arrangement in FIG. 1. A trench intrinsic breakdown voltage of the material of the DTI structures 16 is 120V. For the transient event such as a voltage spike to or above 150V in the device 100, a voltage at node D is 0V, a voltage at node C is 50V, and a voltage at node B is 150V. Voltage above 150V is shorted to the common ground 8. During the voltage spike, current momentarily flows through the Zener diodes (2-1, 2-2), the DTI structures 16, one or more of the poly structures 15, and the N-substrate 12. During the voltage spike, local or differential trench or well voltages are limited as described above. Well to well voltage is limited to the Zener breakdown voltage, and BOX voltage is limited but is different for each well, such as the 100V described above which is below the 120V breakdown voltage. In particular, the differential voltage between node B to substrate is limited to 100V: across wells 3 and 4 is 100V. The differential voltage between node B across wells 4 and 5 is 100V. The differential voltage between nodes C and D is 50V, C to substrate is 0V across wells 5, 6, and 7 is 0V. For IC components formed in the wells 3 through 7, the DTI structures 16 and the BOX 11 are thereby protected against the transient event in the form of a voltage spike to 150V.

FIG. 2 is a block diagram of a cross-sectional view of a device 200 in accordance with additional embodiments for protecting against voltage transients. Voltage protection is provided with respect to a first direction 21 and a second direction 22. The protection is provided in the device 200 by a plurality of voltage protection elements 20 such as a first set of Zener diodes 20-1, 20-2, 20-3 positioned or stacked in a Zener stack configuration for the first direction 21 and by a second set of Zener diodes 20-4, 20-5 for the second direction 22. The protection elements 20 are positioned adjacent to an IC composite layer 9. Intermittently, in operation, the device 200 is subjected to transient events represented by a voltage source 1 (labeled "V"). The Zener stack is coupled to a common ground 8 as shown on a left side of the device 200. The IC composite layer 9 includes a silicon-based IC layer 10, a BOX layer 11, and a substrate layer 12. The voltage protection elements 20 are coupled in parallel with the substrate layer 12 of the IC composite layer 9. The Zener stack protects the IC composite layer 9 from the transient events. The substrate layer 12 intrinsically has a resistance 17. The IC layer 10 is divided into wells or isolated regions 23, 24, 25, 26, and 27 that are electrically isolated by DTI structures 16 or walls, each having an intrinsic breakdown voltage or limit. Between the DTI structures 16 are poly structures 15 allowing electrical connections from the surface of IC composite structure 9 to the substrate 12.

FIG. 3 is a schematic diagram of composite voltage protection components in accordance with additional embodiments. The protection elements 30-1, 30-2 are further examples of voltage protection elements to be used in various configurations as described herein. For example, the protection components 30-1, 30-2 can be used in place of a voltage protection components 2-1, 2-2 and 20-1 through 20-5 in FIG. 1 and FIG. 2, respectively, and in other embodiments described herein as understood by those in the art. A first protective component 30-1 includes a Zener diode 34 and a bipolar junction transistor (BJT) such as an NPN BJT 28. An anode of the Zener diode 34 is coupled to a base of the NPN BJT 28. A cathode of the Zener diode 34 is coupled to a collector of the NPN BJT 28. A second protective component 30-2 includes a Zener diode 34 and a N-channel depletion-mode field effect transistor (FET) 29. An anode of the Zener diode 34 is coupled to a gate of the FET 29, and a cathode of the Zener diode 34 is coupled to a drain of the FET 29.

Figure 4:
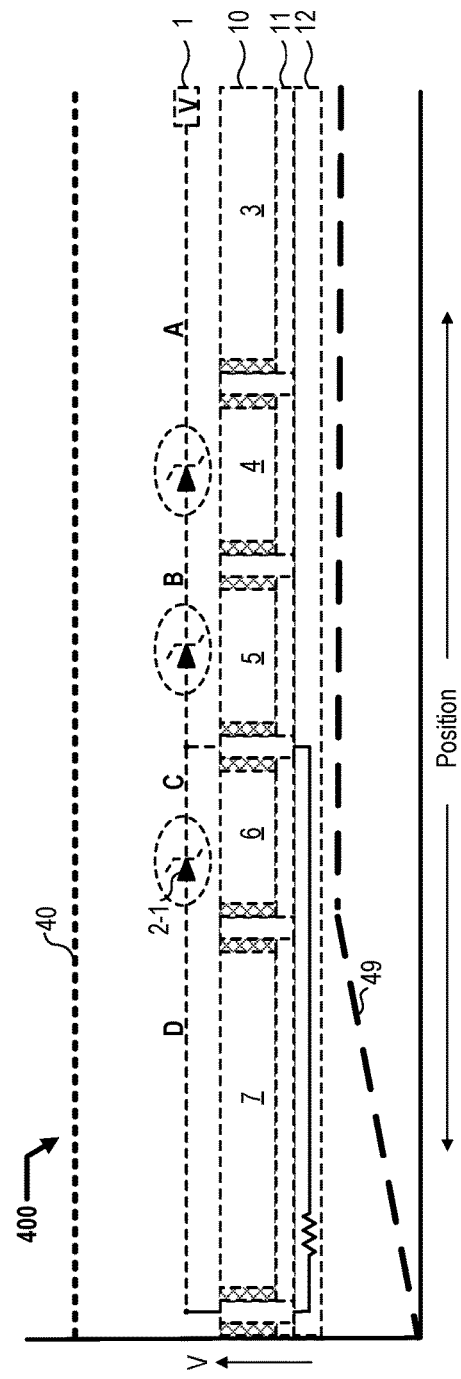
FIG. 4 is a graph of voltage versus position relative to at least one element shown in FIG. 1 in accordance with some embodiments.

FIG. 4 is a graph 400 of voltage versus position in the device 100 relative to at least one element shown in FIG. 1 in accordance with some embodiments. The device 100 is superimposed in dashed lines on the graph 400 for convenience of illustration. The graph 400 illustrates how protection functions during a transient voltage event such as for well 7. In the device 100, and in particular in the elements of the IC composite layer 9, a transient voltage 49 varies with position in the device 100 during the transient voltage event. For example, the voltage remains 100V or less in the N-substrate 12 due to the N-substrate 12 being biased above the common ground 8 and protected by the Zener stack of protection elements including the bottom Zener diode 2-1. The transient voltage 49 varies across the bottom Zener diode 2-1 from 50 volts to 0 volts as indicated by the transient voltage 49. Other elements and other regions are protected in a similar manner. Generally, multiple poly substrate contacts are connected in parallel in the IC composite layer 9. The intrinsic breakdown voltage 40 is 120V. Consequently, the transient voltage 49 is below the intrinsic breakdown voltage 40 across elements of the IC composite layer 9 of the device 100 and protects sensitive IC elements in the wells such as in well 7.

Figure 5:
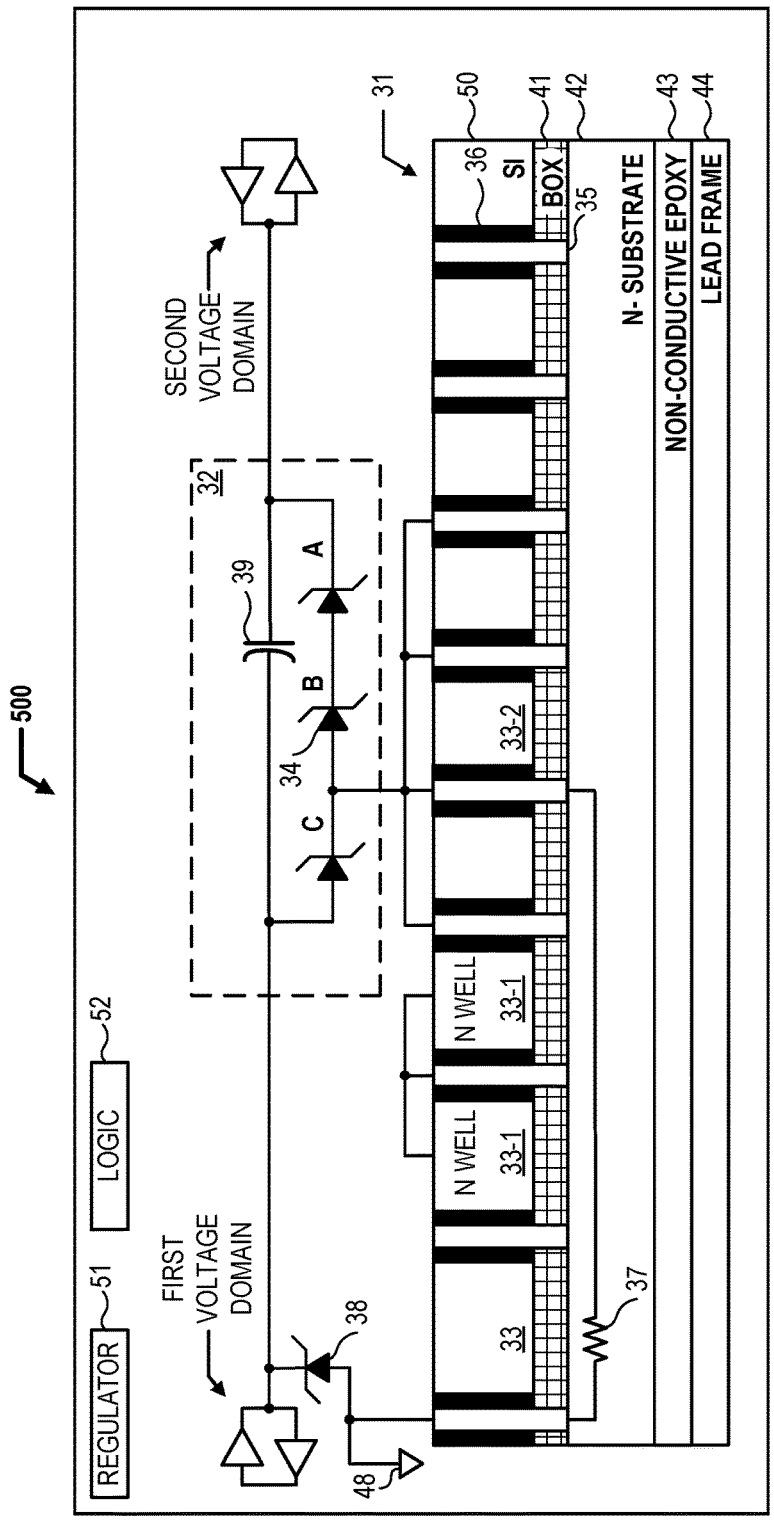
FIG. 5 is a block diagram of a cross-sectional view of an integrated circuit having a low voltage domain and high voltage domain in accordance with some embodiments.

FIG. 5 is a block diagram of a cross-sectional view of a device 500 having a low voltage (LV) domain and high voltage (HV) domain in accordance with some embodiments. High voltage is in reference to a voltage level or level range of the LV domain and is used herein for the sake of distinguishing two voltage domains in a same device and one or more circuits. The LV and HV domains in the device 500 may operate with various voltages or voltage ranges as understood by those in the art. For example, the device 500 includes an LV domain that operates in a range of 12V-18V and an HV domain that operates between 48V-65V in the device 500. Such ranges are typical for, and used in, currently available mild hybrid electric vehicles (MHEVs). Other applications are possible, and other LV and HV operating ranges are possible. Currently, in MHEVs, there are two categories of operating values of the high voltage network in each vehicle: 48V and everything else where a base operating voltage is up to 160V. The 48V category is becoming increasingly popular. In each MHEV, various components require use of energy from one of the LV domain and the HV domain.

The device 500 includes an IC die 31 that, in turn, includes a regulator 51 and logic components 52 for operation of the LV and HV domains as understood by those in the art. The LV domain is protected by a Zener diode 38 rated at 5V and which is coupled at its anode to a common ground 48. The IC 31 of the device 500 includes IC layers: a silicon-based IC layer 50, a buried oxide (BOX) layer 41, and a N-substrate 42. The N-substrate 42 may include a handler wafer. The N-substrate 42 is coupled to a frame such as a lead frame 44 by a non-conductive epoxy layer 43. In some embodiments, the N-substrate 42 is made of one or more silicon-based materials. In other embodiments, the N-substrate layer is made of glass, borosilicon glass, fused quartz, sapphire, silicon carbide, or other electrically-insulating material. The IC layer 50 is separated into wells 33 by poly structures 35 and DTI structures 36. According to some embodiments, wells 33 that do not have IC elements formed therein, such as empty wells 33-1, are self-biased with respect to the N-substrate 42 as illustrated by the lines. One or more of the empty wells 33-1 may be N doped as illustrated in wells 33-1. Other wells 33 such as a second well 33-2 are bounded by poly structures 35 that are coupled to a Zener stack including one or more Zener diodes 34. For a plurality or set of Zener diodes 34, these components are coupled in series in some embodiments, and in other arrangements according to other non-illustrated embodiments. In some embodiments, a breakdown voltage (BV) of the BOX layer 41 is asymmetric such that the BOX layer has a BV rating of +90V/−40V.

Figure 6:
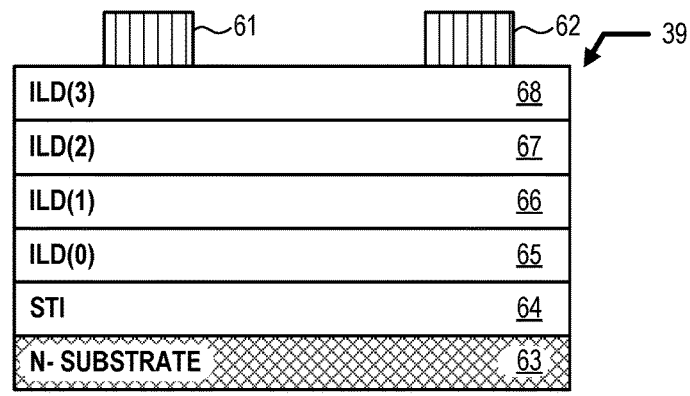
FIG. 6 is a block diagram of a fringe capacitor first shown in FIG. 5 in accordance with some embodiments.

The LV and HV domains are separated from each other by a self-biased isolation substrate region 32. The isolation substrate region 32 includes a fringe capacitor 39 and Zener diodes 34 coupled in parallel with the fringe capacitor 39. Continuing the specific example of FIG. 5, between the 12V-18V LV domain and the 48V-65V HV domain, the fringe capacitor 39 is a "metal 4" (M4) fringe capacitor and is rated at 300V. An embodiment of a fringe capacitor is illustrated in FIG. 6. The fringe capacitor 39 is protected by the Zener diodes 34, each rated at 50V. The Zener diodes 34 operate as ESD clamps. Other isolation techniques to separate the LV and HV domains in the device 500 are possible including use of inductive isolation and corresponding components.

The Zener diodes 34, the IC 31, and other components illustrated in the device 500 operate in a similar fashion to corresponding components illustrated in FIG. 1. For example, when caused by certain conditions, current flows through the N-substrate 42. The N-substrate 42 has an intrinsic resistance 37. The resistance 37 can be measured per unit distance of the N-substrate 42. FIG. 5 illustrates a unidirectional example of current flow with respect to the device 500 and the N-substrate 42. The N-substrate 42 is biased against transient events. During transient events, a transient current flows through the N-substrate 42. During transient events, a transient voltage is greater than a max rating of a dielectric isolation material of the DTI structures 36. However, a differential voltage as measured through the wells 33 such as wells 33-2 adjacent to poly structures 35, the adjacent poly structures 35 being coupled to the Zener diodes 34, is less than the maximum voltage rating of the DTI structures 36 implicated in a particular transient event.

During a transient event, the transient voltage is divided across multiple isolated regions or wells 33 such that the voltage across any single well 33 is less than its theoretical breakdown voltage. A current flow in the N-substrate 42 creates a voltage gradient across the N-substrate 42. The Zener diodes 34 operate as a Zener stack and a divider circuit. The N-substrate 42 is connected to the common ground 48 except at components to be dynamically biased thereby maintaining electromagnetic compatibility (EMC) and ESD performance. In some embodiments, during manufacture, the N-substrate 42 is thinned in thickness for improved transient protection. For example, a thickness of the N-substrate 42 is reduced from approximately 15 mils (381 μm) to approximately 10 mils (254 μm) to 8 mils (205 μm). A thinned N-substrate 42 increases the substrate resistance 37 and minimizes or reduces a substrate current needed to create a differential voltage across the N-substrate 42.

FIG. 6 is a cross-sectional view of a fringe capacitor 39 first shown in FIG. 5 in accordance with some embodiments. The fringe capacitor 39 is formed of metal lines such as a first metal line 61 and a second metal line 62 of a same metal layer (e.g., metal layer 4 (M4)) in an IC such as an IC shown in other figures. While two metal lines 61, 62 are shown, multiple metal lines may be arranged parallel with each other to form the fringe capacitor 39. The fringe capacitor 39 is formed proximate or coupled to a base layer such as a N-substrate 63, a layer of shallow trench isolation (STI) such as STI layer 64, and one or more layers of interlayer dielectric (ILD) material such as ILD layers 65-68. No circuit components are formed in the ILD layers 65-68. The fringe capacitor 39 is built layer by layer, line by line such as in or over one or more wells 33 shown in FIG. 5. In some embodiments, each of the ILD layers 65-68 is made of or includes tetraethyl orthosilicate (TEOS). Alternatively, each ILD layer 65-68 is made of or includes silane and other silicon source. As a particular example of an embodiment, the first and fourth ILD layers 65, 68 are each comprised of 8 k TEOS corresponding to a rating of 560V each, and the second and third ILD layers 66, 67 are each comprised of 7 k TEOS corresponding to a rating of 490V each. This construction of the ILD layers 65-68, taken together, corresponds to 30 k TEOS and approximately 2 kV. This corresponds to approximately 70 Mv/cm (700V/μm).

The fringe capacitor 39 is an embodiment of a metal-to-metal capacitor and provides a stable high capacitance and exhibits low on-chip leakage. In some embodiments, while not illustrated, a low-impedance conductive plate is constructed in a poly silicon layer between the metal layer of the metal lines 61, 62 and the STI layer 64 or in another location to capacitively isolate the metal lines 61, 62.

Figure 7:
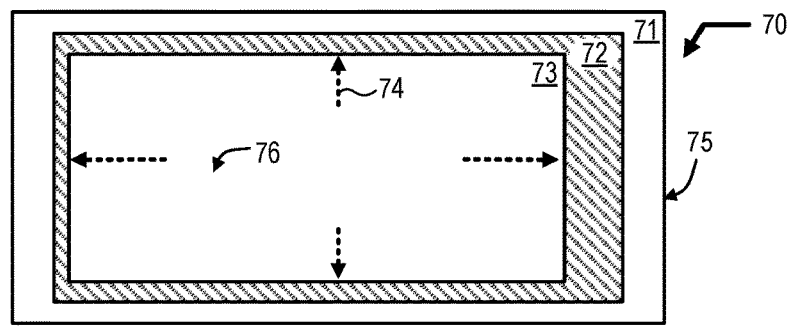
FIG. 7 is a plan view of a circuit layout in accordance with some embodiments.

FIG. 7 is a plan view of a circuit layout 70 for use in a device such as device 500 of FIG. 5 in accordance with some embodiments. An IC die 71 includes a self-biased substrate (not labeled) below a top surface 76 of the IC die 71. The self-biased substrate is coupled to ground such as at one or more points or along one or more sides of the self-biased substrate. The IC die 71 includes an edge seal 72 that defines a first region 73 that is protected by the self-biased substrate. The edge seal is comprised of at least one of a poly silicon ("poly") and a DTI material. For sake of convenience, individual wells or sub-regions divided by a poly or a DTI region are not illustrated in the first region 73. While the first region 73 is shown surrounded by or defined by the edge seal 72, in some embodiments, the self-biased substrate and the first region 73 can extend to an outer edge 75 at one or more of the four sides. The first region 73 includes one or more of silicon layers, metal-based layers, insulation layers, and a BOX layer as part of a composite layer for an electronic device. For example, the first region 73 includes elements such as those of layers 10 and 11 of FIG. 1 in addition to the self-biased substrate. With reference to FIG. 7, the first region 73 is protected against transient events represented by arrows 74 of transient current flowing toward ground toward the four sides of the self-biased substrate. That is, the transient current is flowing in parallel in four directions. Due to the transient current flowing in parallel in four directions, an effective resistance of the self-biased substrate would need to be designed at approximately four times a linear resistance of the same. Other embodiments can improve upon this layout 70 in terms of resistance of the self-biased substrate.

Figure 8:
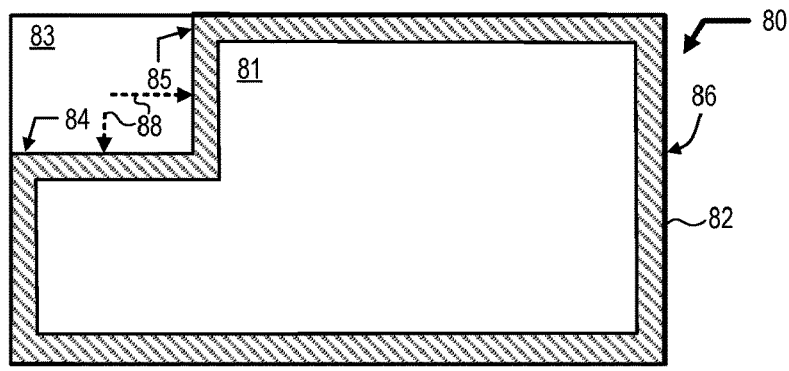
FIG. 8 is a plan view of a circuit layout in accordance with other embodiments.

FIG. 8 is a plan view of a circuit layout 80 in accordance with other embodiments that improves upon the layout 70 shown in FIG. 7 by having transient current flow to only two sides of an IC die 81. The IC die 81 includes an edge seal 82 along a portion of outer edges 86 of the layout 80 and IC die 81. The IC die 81 includes one or more of silicon layers, metal-based layers, insulation layers, and a BOX layer as part of a composite layer for an electronic device. For example, a first region 83 of the IC die 81 includes elements such as those of layers 9 and 10 of FIGS. 1 and 2.

The IC die 81 includes a self-biased substrate (not labeled) that protects against transient events (represented by arrows) of transient current 88 flowing through one or more parts of the first region 83 and toward two portions of the edge seal 82—a first side 84 and a second side 85 of the first region 83. Due the transient current 88 flowing in parallel in only two directions, an effective resistance of the self-biased substrate would only need to be designed at approximately two times a linear resistance of the same when compared against the layout 70 of FIG. 7. As shown in FIG. 8, a layout 80 in a corner or along an edge of an IC die 81 minimizes a space between a substrate bias circuit and grounded substrate contacts. While not illustrated, a non-conductive epoxy layer is applied to facilitate control of a resistance of the self-biased substrate.

Figure 9:
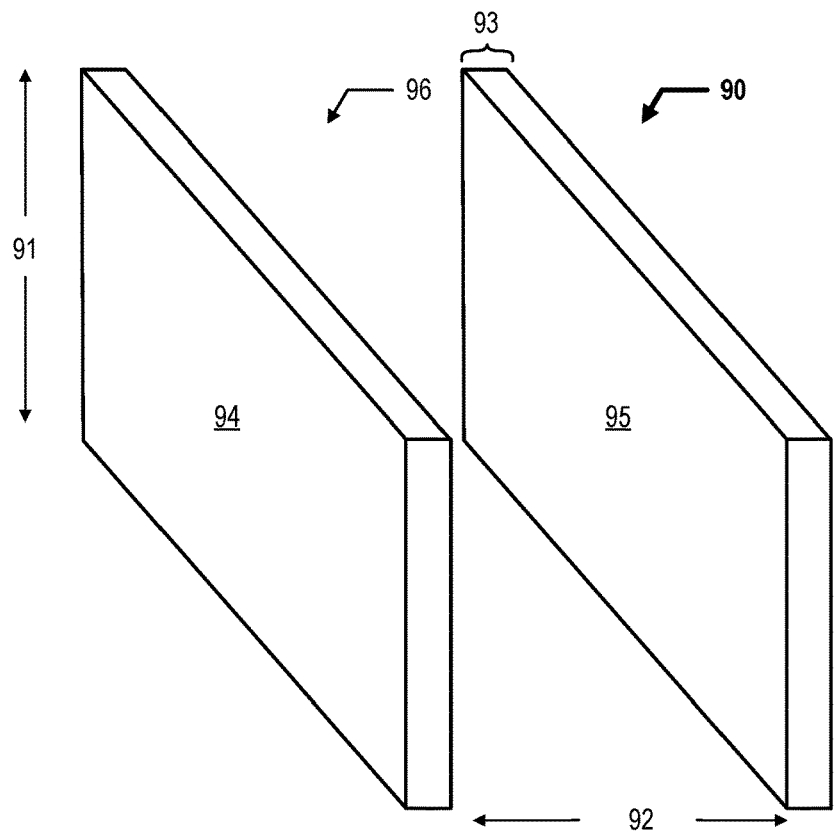
FIG. 9 is a perspective view of deep trench isolation structures of an integrated circuit according to some embodiments.

FIG. 9 is a perspective view of an arrangement 90 of deep trench isolation (DTI) structures 94, 95 of an integrated circuit according to some embodiments to show calculation of a design resistance for a self-biased substrate that would extend in a plane beneath the DTI structures 94, 95. For sake of simplicity in showing features of transient event protection, the DTI structures 94, 95 are illustrated as cuboid in shape and other IC components are omitted from FIG. 9. A volume 96 is defined between the DTI structures 94, 95. Other shapes and arrangements of DTI structures are possible when creating IC dies having the features described herein as would be known to those in the art. Each DTI structure 94, 95 has a height 91 and a thickness 93. The DTI structures 94, 95 are separated by a lateral distance 92. For a lateral distance 92 of 30 microns (μm or micrometer), a substrate resistance is determined to be 32 ohms per micron, which equates to approximately 1 k ohm per square unit in microns ($\mu m^2$).

According to some embodiments for an RC time constant, an ESD event is approximately 5 nanoseconds (ns) in duration, and with a well capacitance of approximately 12 pF, an overall substrate resistance equates to approximately 400 ohms. In a scenario where the current flow is in four directions (to the edges of a self-biased substrate) the substrate resistance would need to be approximately 1,600 ohms. Further values can be determined for a substrate thinned to approximately 8-10 mils in thickness when designing a self-biasing substrate such as the N-substrate 42 of FIG. 5.

Figure 10:
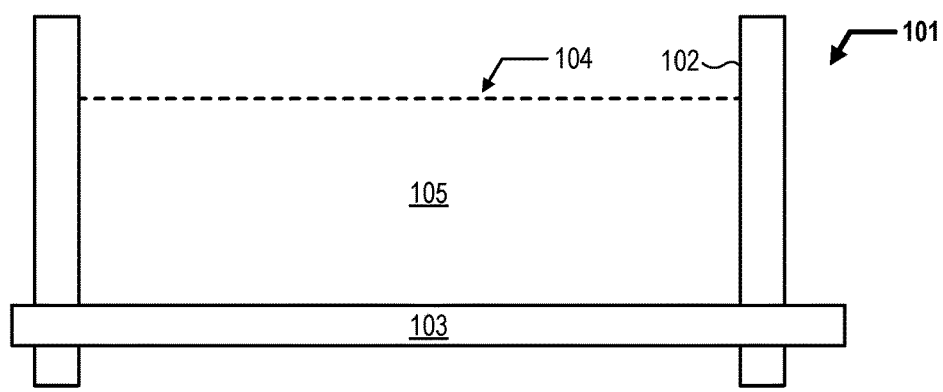
FIG. 10 is a cross-sectional view of a well separated by deep trench isolation structures according to some embodiments.

FIG. 10 is a cross-sectional view of a well separated by deep trench isolation structures according to some embodiments. FIG. 10 illustrates an embodiment for determining a capacitance value for use in determining an RC timing constant of a self-biased substrate circuit. An arrangement 101 includes a pair of DTI structures 102 separated by a distance. A section of a self-biased substrate 103 underlies the DTI structures 102. A volume 104 of well material 105 lies in the well. For an N-type well material, a measurement of 0.8 pF was measured for a tub area of approximately 11,000 square microns corresponding to a unit capacitance of approximately 0.0007 pF per sq. micron. For a P-type well material, a measurement of 3 pF was measured for a tub area of approximately 14,000 square microns (118 μm×118 μm) corresponding to a unit capacitance of approximately 0.0007 pF per sq. micron.

Figure 11:
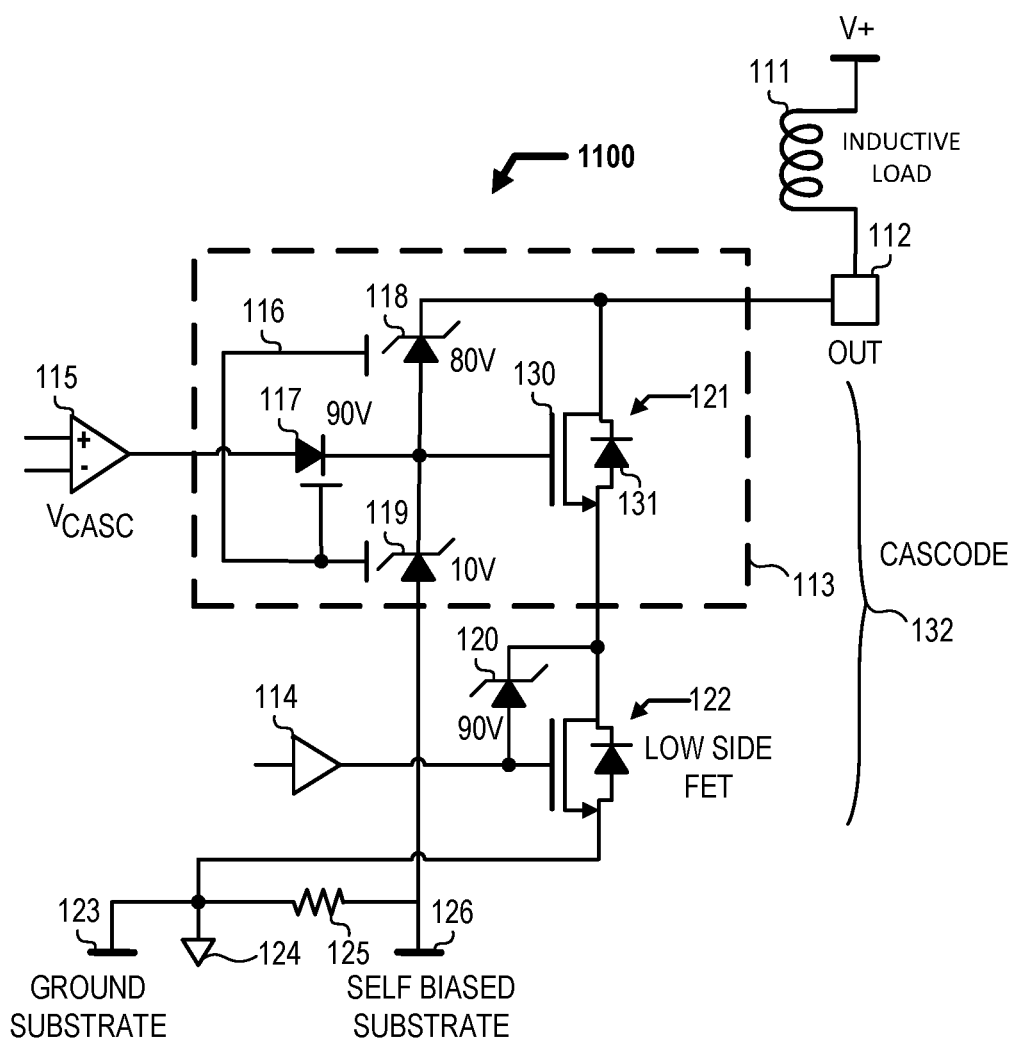
FIG. 11 is a circuit diagram for a circuit having a self-biased substrate according to some embodiments.

FIG. 11 is a circuit diagram and second example for a circuit having a self-biased substrate according to some embodiments. A circuit 1100 facilitates providing a voltage to an inductive load 111 at a voltage out pin 112 (labeled "OUT") where the voltage out originates from an input voltage represented by a filter 114 and a cascode voltage ($V_{casc}$) represented by an op amp 115 as understood by those in the art. The circuit 1100 provides voltage regulation including protection against transient events. The circuit 1100 includes a cascode circuit portion 132. The cascode circuit portion 132 includes a high side field effect transistor (FET) 121 and a low side FET 122. Each of the high side and low side FETs 121, 122 includes a transistor such as a first transistor 130. Each FET 121, 122 is protected by a diode, such as a first protective diode 131, where the diode 131 is coupled as shown between a respective source and drain.

The cascode circuit portion 132 includes a Zener stack that includes a first Zener diode 118 and a second Zener diode 119. A breakdown voltage of the second Zener diode 119 is greater than a voltage of the cascode voltage $V_{casc}$. The op amp 115 is coupled to the high side FET 121 by way of a protective diode 117. For example, the diode 117 is rated at 90V. The filter 114 is coupled to a third Zener diode 120 and a gate of the low side FET 122. By way of example, the third Zener diode 120 is rated at 90V.

The circuit 1100 also includes a self-biased substrate 126 having a substrate resistance 125 and is located at least in a substrate region 113. Substrate biasing is represented by lines 116. The substrate 126 is biased so as to limit a maximum voltage across the substrate 126 and across a dielectric isolation (not illustrated in FIG. 11) associated with the substrate 126. For example, the substrate biasing limits the voltage across the substrate 126 to 90V. The substrate 126 is coupled to a common ground 124 which is also coupled to a ground substrate 123. The breakdown voltage of a combination of the first and second Zener diodes 118, 119 is less than a breakdown voltage (BVDSS) of the substrate 126. The cascode circuit portion 132 is thereby self-protected at the low side driver FET 122. As an example, the $V_{casc}$ is 7V, the second Zener diode 119 is rated at 10V, and the first Zener diode 118 is rated at 80V. With these values, a voltage at the output pin 112 can sustain a transient event of approximately 180V while the voltage across the substrate 126 is limited to 90V based on the arrangement of the components illustrated. In this example, the 90V experienced by the self-biased substrate 126 is below its breakdown voltage of 120V. A circuit built according to the circuit diagram of FIG. 11 may be physically large to accommodate the various components therein, but it is advantageously monolithic.

In general, as shown and explained herein, a solution to protect trench oxides from transient events that exceed the theoretical breakdown of a circuit substrate includes dynamically biasing the substrate and dividing the transient voltage across multiple isolated regions. A result is such that the voltage across any single trench is less than the theoretical breakdown voltage. Such solution is particularly useful in silicon-on-insulator (SOI) devices but can be used in many different types and arrangements of circuits.

Conclusion. Note that not all of the activities, features, or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A biased substrate circuit comprising:
   an integrated circuit (IC) layer divided into wells by dielectric isolation regions of a dielectric isolation material, the dielectric isolation material having a first breakdown voltage;
   a base substrate layer separated from the IC layer by an insulation layer having a second breakdown voltage; and
   a voltage protection stack coupled to the base substrate layer in at least two different locations, the voltage protection stack including a plurality of voltage protection components, the voltage protection stack having a stack breakdown voltage greater than the first breakdown voltage and the second breakdown voltage.

2. The biased substrate circuit of claim 1, wherein:
   the voltage protection stack has a stack voltage level;
   each well of the IC layer has a breakdown voltage level; and
   when the stack voltage level is exceeded, an applied voltage is divided across multiple wells of the IC layer such that a voltage level across any single well's dielectric isolation is less than the well's breakdown voltage level.

3. The biased substrate circuit of claim 1, wherein the biased substrate circuit is positioned at a corner or edge of a die that includes the IC layer.

4. The biased substrate circuit of claim 1, further comprising:
   an edge seal along a periphery of the IC layer without a ground contact connecting the IC layer to ground.

5. The substrate biasing circuit of claim 1, further comprising:
   a non-conductive epoxy layer coupled to the base layer.

6. The substrate biasing circuit of claim 1, wherein the base layer is 10 mils or less in thickness at a first point in the IC layer.

7. A device comprising:
   a substrate layer separated by a buried oxide (BOX) layer, having a BOX isolation breakdown voltage, from an integrated circuit (IC) layer, the IC layer having IC components;
   at least a first isolation structure disposed proximate to the IC layer, the first isolation structure extending through the BOX layer at least to the substrate layer, and the first isolation structure having an isolation breakdown voltage, the first isolation structure isolating the IC components; and
   a protective stack having a stack breakdown voltage greater than the isolation breakdown voltage, the stack coupled to the substrate layer in at least two different locations, the stack comprising:
   a first voltage protection component having a first anode coupled to one of the at least two different locations and a first cathode coupled to the first isolation structure and operable in use to receive a transient voltage, a difference between the transient voltage at a cathode of the stack and the substrate bias voltage being less than the isolation breakdown voltage; and
   a second voltage protection component having a second anode and a second cathode, the second anode coupled to the first cathode of the first voltage protection component, the second cathode of the second voltage protection component being at the cathode of the stack.

8. The device of claim 7, wherein one of the at least two different locations is a ground.

9. The device of claim 7, further comprising:
a second isolation structure in the IC layer, the second isolation structure extending through the BOX layer at least to the substrate layer, and the second isolation structure coupled to ground, the first and second isolation structures defining a well of IC material.

10. The device of claim 9, wherein the first and the second isolation structures comprise a deep trench isolation (DTI) material.

11. The device of claim 7, wherein:
the substrate layer is N- doped; or
the well of IC material is doped with an N-based doping material.

12. The device of claim 7, wherein the first voltage protection component includes a first Zener diode, and wherein the second voltage protection component includes a second Zener diode, and wherein each of the first and second voltage protection components has a breakdown voltage less than a breakdown voltage of the DTI material.

13. The device of claim 7, wherein IC components are formed in a well of IC material adjacent to an edge of the device and adjacent to the first isolation structure.

14. The device of claim 7, wherein:
the IC layer includes a plurality of wells of silicon-based IC material defined by a plurality of isolation structures, each isolation structure including a poly silicon material.

15. The device of claim 14, wherein:
a first well of the plurality of wells includes active IC components; and
a second well of the plurality of wells is devoid of any active IC components, the second well electrically isolating the first well from ground.

16. The device of claim 7, wherein the BOX layer is formed with an asymmetric breakdown voltage with respect to a voltage of a first voltage domain in the IC layer, the first voltage domain couplable to a first voltage source for operation of the IC components in the IC layer.

17. An electronic device comprising:
a voltage protection stack including a plurality of voltage protection components, wherein an anode of at least one of the voltage protection components is grounded, wherein a cathode of at least one of the voltage protection components is coupled to a load, the voltage protection stack having a stack breakdown voltage;
an integrated circuit (IC) layer having an IC layer breakdown voltage, the IC layer including:
active IC components, the IC layer coupled to a first voltage source of a first voltage level for operation of the active IC components; and
a first poly silicon region coupled to a cathode of at least one of the voltage protection components of the voltage protection stack;
an insulator layer having a first side adjacent to the IC layer; and
a substrate layer adjacent to a second side of the insulator layer, wherein the voltage protection stack breakdown voltage of the voltage protection stack is greater than the IC layer breakdown voltage.

18. The electronic device of claim 17, further comprising:
a first voltage source configured to provide a first voltage level; and
a second voltage source configured to provide a second voltage level to the IC layer for operation of the active IC components in the IC layer, the second voltage level different from the first voltage level.

19. The electronic device of claim 17, further comprising:
a capacitor coupled in parallel with the voltage protection stack between the first voltage source and the second voltage source, and wherein at least one of the voltage protection components includes a Zener diode.

20. The electronic device of claim 17, wherein:
the IC layer further includes a second poly silicon region coupled to ground; and
a trench isolation structure separates the IC layer from the first and the second poly silicon regions.

\* \* \* \* \*